(12) United States Patent
Tomooka et al.

(10) Patent No.: US 7,661,183 B2
(45) Date of Patent: Feb. 16, 2010

(54) BLADE CHANGING TOOL

(75) Inventors: Yusaku Tomooka, Ota-Ku (JP); Kiwato Ohmoto, Ota-ku (JP); Ryoji Itaoka, Ota-ku (JP)

(73) Assignee: Disco Corporation, Tokyo (JP)

( * ) Notice: Subject to any disclaimer, the term of this patent is extended or adjusted under 35 U.S.C. 154(b) by 29 days.

(21) Appl. No.: 12/135,730

(22) Filed: Jun. 9, 2008

(65) Prior Publication Data
US 2008/0313875 A1 Dec. 25, 2008

(30) Foreign Application Priority Data
Jun. 25, 2007 (JP) .............................. 2007-166313

(51) Int. Cl.
*B25B 27/00* (2006.01)
(52) U.S. Cl. .......................................... 29/270; 29/278
(58) Field of Classification Search .................. 29/270, 29/278, 268, 255
See application file for complete search history.

(56) References Cited

U.S. PATENT DOCUMENTS 2,355,582 A * 8/1944 Zempel ..................... 408/146
5,005,279 A * 4/1991 Kooiker ..................... 29/426.5
6,073,349 A * 6/2000 Liversidge .................. 30/90.7
6,148,493 A * 11/2000 Pixley et al. ................. 29/275
6,415,492 B1 * 7/2002 Jamison ..................... 29/275
6,742,421 B1 * 6/2004 Chen ........................... 81/490
7,337,515 B2 * 3/2008 Phillips et al. ............... 29/254
2005/0270696 A1 * 12/2005 Aoishi et al. ............... 360/133
2008/0313875 A1 * 12/2008 Tomooka et al. ............ 29/270

FOREIGN PATENT DOCUMENTS

JP U 7-3952 1/1995

* cited by examiner

*Primary Examiner*—Lee D Wilson
(74) *Attorney, Agent, or Firm*—Greer, Burns & Crain, Ltd

(57) ABSTRACT

A blade changing tool for use in a cutting device including a chuck table for holding a workpiece and a cutting device including a blade mount for rotatably supporting a cutting blade for cutting the workpiece held by the chuck table. The blade changing tool includes a C-shaped elastic cylindrical body including a cutout formed by cutting out a part of a circular cylinder, a holding groove formed on the inner circumferential surface of the cylindrical body at one end portion thereof and adapted to surround a circular hub of the cutting blade, and a grip portion adapted to be gripped by an operator for making a change from an inoperative condition where the circular hub of the cutting blade is surrounded by the inner circumference of the cylindrical body to an operative condition where the circular hub is held by the inner circumference of the cylindrical body.

2 Claims, 8 Drawing Sheets

BLADE CHANGING TOOL

BACKGROUND OF THE INVENTION

1. Field of the Invention

The present invention relates to a blade changing tool suitable for use in mounting a hub blade having a circular hub to a spindle of a cutting device or in demounting the hub blade from the spindle.

2. Description of the Related Art

In a dicing device or the like, a cutting blade having a thin cutting edge is mounted to a blade mount provided at the front end of a spindle, wherein the cutting blade is used to cut a silicon wafer on which ICs or LSIs are formed, a resin board, a glass plate, etc., thereby separating individual LSI chips or electronic devices. The cutting blade most used in the dicing device at present is called a hub blade, which is composed of a circular base having a circular hub and a cutting edge formed along the outer circumference of the circular base by electroforming of diamond abrasive grains. If a very brittle cutting blade having a thickness of about 20 to 30 μm is directly held by an operator's hand, there is a possibility that the cutting blade may be easily damaged. To cope with this problem, the cutting edge of the hub blade is formed along the outer circumference of the circular base having the circular hub to be held by the fingers.

However, there is a case that the circular hub of the circular base is narrow in width or the fingers are necessarily put on the circular hub near the cutting edge. As a result, there is a possibility that the cutting edge may be erroneously broken by the fingers or that the fingers may be erroneously cut by the cutting edge. Further, since the edge portion of the circular hub is sharp in shape, there is a possibility that the fingers firmly gripping the circular hub may be cut by the sharp edge portion of the circular hub. In view of these circumstances, there have been proposed various blade changing tools for changing a cutting blade. For example, Japanese Utility Model Laid-open No. Hei 7-3952 discloses a blade changing jig for easily changing a cutting blade mounted through a flange member to the front end of a spindle in a dicing device or the like.

The blade cutting jig disclosed in Japanese Utility Model Laid-open No. Hei 7-3952 is specially designed for the replacement of a ringlike cutting blade (ring blade), and does not support a hub blade. In general, a blade changing jig (blade changing tool) configured by removing a magnet from the blade changing jig disclosed in Japanese Utility Model Laid-open No. Hei 7-3952 is used in removing a hub blade or a flange with a hub.

This blade changing tool has a structure like a clothespin such that when a finger operated portion is nipped by the fingers, a blade holding portion is opened, whereas when a force applied to the finger operated portion is removed, the blade holding portion is closed by a spring to hold the blade. Accordingly, in the condition where the blade is held by the tool, a holding force cannot be applied to the tool, and there is a possibility that the blade holding portion may become unstable due to settling of the spring, for example. In addition, the degree of opening of the blade holding portion is not limited, so that there is a possibility that the tool may strike the blade in holding the blade, causing damage to the blade.

SUMMARY OF THE INVENTION

It is therefore an object of the present invention to provide a blade changing tool which can easily change a cutting blade with a hub without damage to the blade.

In accordance with an aspect of the present invention, there is provided a blade changing tool for use in a cutting device including a chuck table for holding a workpiece and cutting means including a blade mount for rotatably supporting a cutting blade for cutting the workpiece held by the chuck table, wherein the cutting blade includes a circular base including an insertion hole for insertion of a mounting projection formed at the center of the blade mount, a circular hub formed integrally with the circular base on one side surface of the circular base, and a cutting edge formed along the outer circumference of the circular base so as to project radially outward therefrom; and the blade changing tool includes a C-shaped elastic cylindrical body including a cutout formed by cutting out a part of a circular cylinder; a holding groove formed on the inner circumferential surface of the cylindrical body at one end portion thereof and adapted to surround the circular hub of the cutting blade; and a grip portion adapted to be gripped by an operator for making a change from an inoperative condition where the circular hub of the cutting blade is surrounded by the inner circumference of the cylindrical body to an operative condition where the circular hub is held by the inner circumference of the cylindrical body.

Preferably, the grip portion includes a thumb receiving portion for receiving the thumb of the right or left hand of the operator and a three-finger receiving portion formed opposite to the thumb receiving portion with respect to the cutout for receiving the index finger, middle finger, and ring finger of the right or left hand of the operator.

Preferably, the thumb receiving portion includes a first concave portion formed on the outer circumference of the cylindrical body and adapted to fittedly receive the thumb holding the grip portion, and a first stopper portion formed on the outer circumference of the cylindrical body at the same circumferential position as that of the first concave portion so as to project radially outward at the one end portion of the cylindrical body; and the three-finger receiving portion includes second, third, and fourth concave portions formed on the outer circumference of the cylindrical body and adapted to respectively fittedly receive the index finger, middle finger, and ring finger holding the grip portion, and a second stopper portion formed on the outer circumference of the cylindrical body at the same circumferential position as that of the second, third, and fourth concave portions so as to project radially outward at the one end portion of the cylindrical body. Preferably, the outer diameter of the cylindrical body is larger than the outer diameter of the circular hub of the cutting blade and smaller than the outer diameter of the circular base of the cutting blade.

By the use of the blade changing tool according to the present invention, the cutting blade can be changed easily and quickly without damage to the cutting edge in changing the blade. The thumb receiving portion and the three-finger receiving portion respectively include the first stopper portion and the second stopper portion. Accordingly, it is possible to prevent that the fingers gripping the blade changing tool may abut against the cutting blade in changing the blade to cause damage to the cutting edge of the blade.

Further, the outer diameter of the cylindrical body of the blade changing tool is smaller than the outer diameter of the circular base of the cutting blade. Accordingly, it is possible to prevent that the blade changing tool may strike the cutting blade to cause damage to the cutting edge of the blade.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
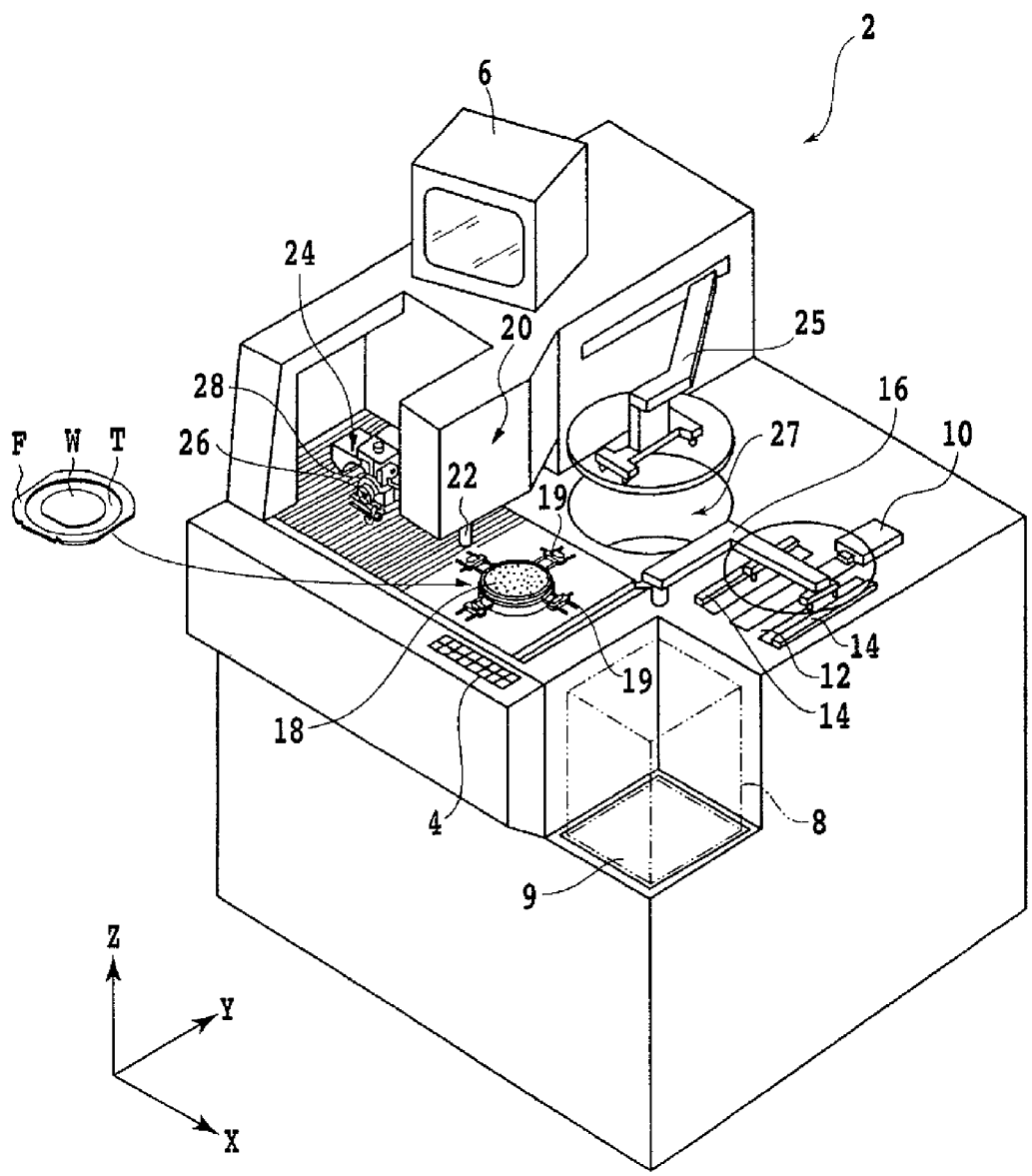
FIG. 1 is a perspective view of a cutting device having a cutting blade to which the blade changing tool according to the present invention is applicable.

A preferred embodiment of the present invention will now be described with reference to the drawings. FIG. 1 is a perspective view of a cutting device 2 for dicing a wafer to separate it into individual chips (devices). The front portion of the cutting device 2 is provided with operating means 4 through which an operator inputs instructions such as working conditions to the cutting device 2. The upper portion of the cutting device 2 is provided with displaying means 6 such as a CRT for displaying a guide screen for the operator or an image obtained by imaging means to be hereinafter described.

Figure 2:
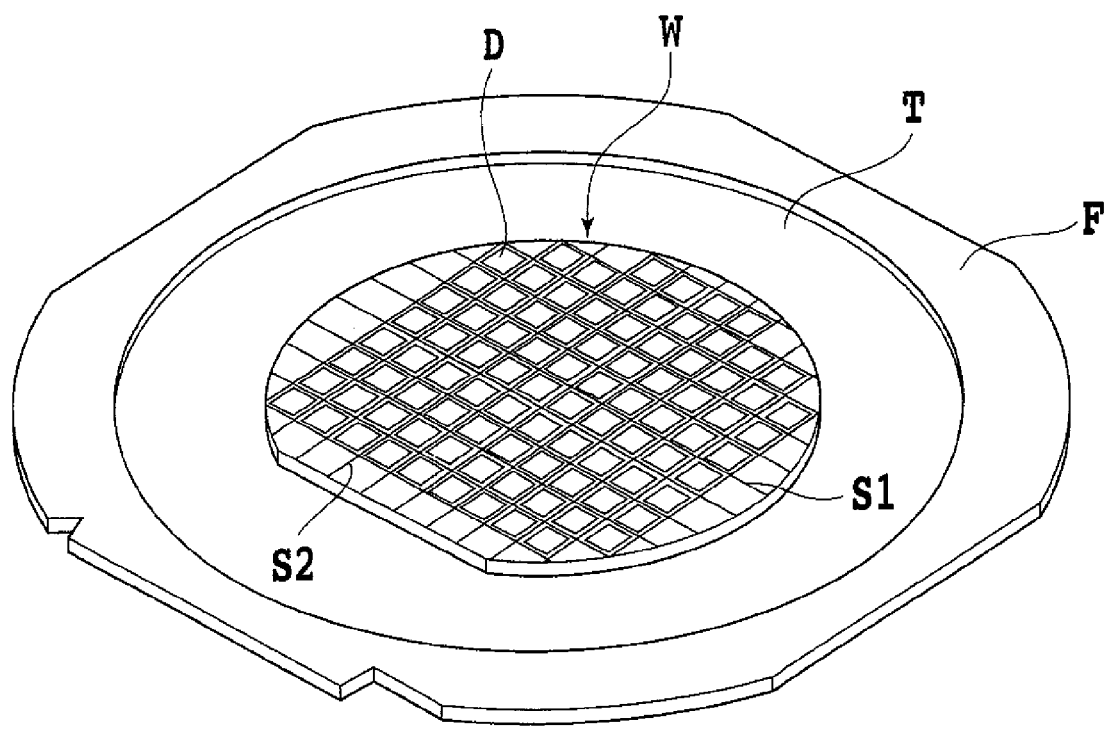
FIG. 2 is a perspective view of a wafer integrated with a frame.

Referring to FIG. 2, there is shown a wafer W as a workpiece to be cut by the cutting device 2. The upper surface of the wafer W is formed with a plurality of first streets S1 and a plurality of second streets S2 intersecting perpendicular to the first streets S1, thereby forming a plurality of devices D partitioned from each other on the upper surface of the wafer W. The wafer W is attached to a dicing tape T as an adhesive tape, and the outer circumferential portion of the dicing tape T is attached to an annular frame F. Thus, the wafer W is supported through the dicing tape T to the frame F. A plurality of such wafers W (e.g., 25 wafers W) supported to the frames F are stored in a wafer cassette 8 shown in FIG. 1. The wafer cassette 8 is placed on a vertically movable cassette elevator 9.

Pickup means 10 is provided on the rear side of the wafer cassette 8. The pickup means 10 functions to pick up one of the wafers W out of the wafer cassette 8 before cutting and to bring the wafer W into the wafer cassette 8 after cutting. A temporary placement area 12 is formed between the wafer cassette 8 and the pickup means 10, wherein the wafer W picked up by the pickup means 10 is temporarily placed in the temporary placement area 12. A pair of positioning means 14 for positioning the wafer W are provided in the temporary placement area 12. There is provided in the vicinity of the temporary placement area 12 handling means 16 having a swivel arm for handing the wafer W by holding the frame F integrated with the wafer W under suction vacuum, wherein the wafer W placed in the temporary placement area 12 is handled by the handling means 16 and carried onto a chuck table 18. The wafer W is held on the chuck table 18 under suction vacuum and the frame F is clamped to the chuck table 18 by a plurality of clamping means 19.

The chuck table 18 is rotatable and reciprocatable in the X direction shown by an arrow X in FIG. 1. Alignment means 20 for detecting the street formed on the wafer W to be cut is provided above a path of movement of the chuck table 18 in the X direction. The alignment means 20 includes imaging means 22 for imaging the upper surface of the wafer W, wherein the street to be cut can be detected by image processing such as pattern matching according to an image obtained by the imaging means 22. The image obtained by the imaging means 22 is displayed by the displaying means 6.

Cutting means 24 for cutting the wafer W held on the chuck table 18 is provided on the left side of the alignment means 20 as viewed in FIG. 1. The cutting means 24 is integrated with the alignment means 20, so that both the cutting means 24 and the alignment means 20 are movable together in the Y direction and the Z direction respectively shown by arrows Y and Z in FIG. 1. The cutting means 24 includes a rotatable spindle 26 and a cutting blade 28 mounted on the spindle 26 at its front end, and is movable in the Y and Z directions. The cutting blade 28 is located on an extension line extending from the imaging means 22 in the X direction.

In the cutting device 2 mentioned above, one of the wafers W stored in the wafer cassette 8 is picked up by the pickup means 10. In this condition, the pickup means 10 is moved toward the rear side of the cutting device 2 (in the Y direction), thereby moving the wafer W to the temporary placement area 12. Then, the pickup means 10 releases the wafer W to place the wafer W in the temporary placement area 12. In this condition, the pair of positioning means 14 opposed to each other are moved toward each other to thereby position the wafer W. Thereafter, the frame F integrated with the wafer W is held under suction vacuum by the handling means 16, and the swivel arm of the handling means 16 is turned to thereby carry the wafer W to the chuck table 18. Then, the wafer W is held on the chuck table 18. In this condition, the chuck table 18 is moved in the X direction to position the wafer W directly below the alignment means 20.

It is necessary to preliminarily obtain the image to be used in pattern matching by the alignment means 20 for detecting the street to be cut. Accordingly, when the wafer W is positioned directly below the alignment means 20, the upper surface of the wafer W is imaged by the imaging means 22, and the image obtained by the imaging means 22 is displayed by the displaying means 6. The operating means 4 is operated by the operator of the cutting device 2 to thereby slowly move the imaging means 22 and to also move the chuck table 18 as required, thus searching for a pattern (key pattern) as a target for pattern matching.

When the key pattern is decided by the operator, the image containing this key pattern is stored into a memory included in the alignment means 20 of the cutting device 2. Further, the distance between the key pattern and the center line of each of the streets S1 and S2 is obtained by using coordinate values or the like, and the values indicating this distance are also stored into the memory of the alignment means 20. Further, the imaging means 22 is moved to obtain the spacing (street pitch) between the adjacent streets by using coordinate values or the like, and the values indicating the street pitch are also stored into the memory of the alignment means 20.

In cutting the wafer W along the streets, the upper surface of the wafer W is imaged by the imaging means 22 to obtain an actual image, and pattern matching between this actual image and the image of the key pattern stored above is performed by the alignment means 20. When both the patterns are matched, the cutting means 24 is moved in the Y direction by the distance between the key pattern and the center line of the street to be cut, thereby aligning the cutting blade 28 to the street to be cut.

In the condition where the cutting blade 28 is aligned to the street to be cut, the chuck table 18 is moved in the X direction. At the same time, the cutting blade 28 is rotated at a high speed and the cutting means 24 is lowered to thereby cut the target street. After cutting the target street, the cutting means 24 is indexed in the Y direction by the street pitch stored in the memory to perform a similar cutting operation, thereby cutting all the streets S1 extending in the same direction. Thereafter, the chuck table 18 is rotated 90°, and a similar cutting operation is performed to cut all the streets S2 intersecting perpendicular to the streets S1. As a result, the individual devices D separated along the streets S1 and S2 can be obtained on the upper surface of the wafer W.

After completing the cutting operation, the chuck table 18 is moved in the X direction and the wafer W held on the chuck table 18 is carried to cleaning means 27 by handling means 25 movable in the Y direction. The cleaning means 27 includes a cleaning nozzle for supplying a jet of cleaning water toward the wafer W rotating at a low speed (e.g., 300 rpm), thereby cleaning the wafer W. After performing this cleaning operation, the wafer W is dried by a jet of air supplied from an air nozzle as rotating the wafer W at a high speed (e.g., 3000 rpm). Thereafter, the wafer W is held under suction vacuum by the handling means 16 and carried to the temporary placement area 12. Further, the wafer W is returned from the temporary placement area 12 to the original position in the wafer cassette 8 by the pickup means 10.

Figure 3:
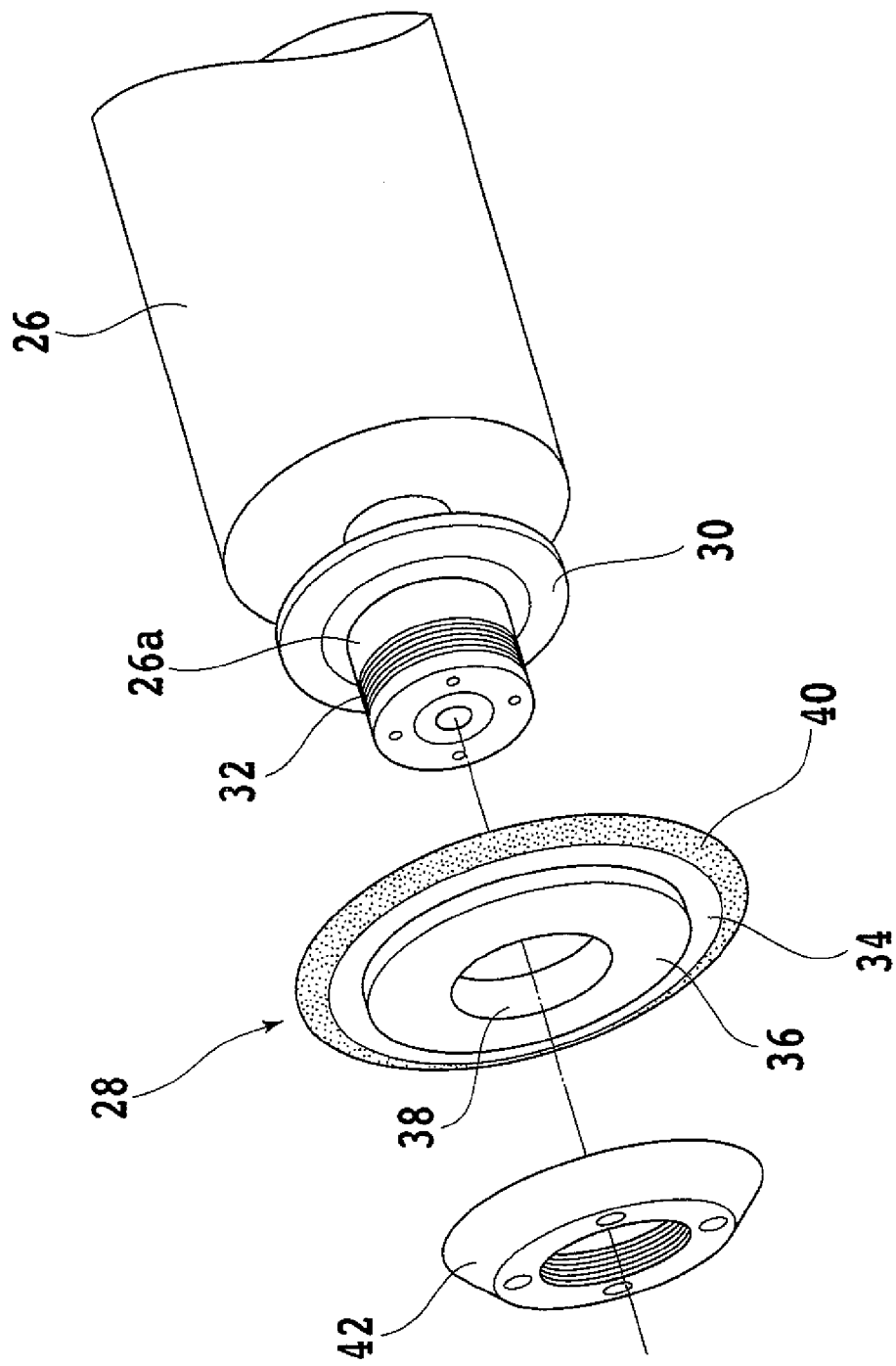
FIG. 3 is an exploded perspective view for illustrating the relation between a blade mount of a spindle and a cutting blade to be mounted thereto.

Referring to FIG. 3, there is shown an exploded perspective view for illustrating the relation between the front end of the spindle 26 and the cutting blade (hub blade) 28 to be mounted thereto. The spindle 26 has a small-diameter front end projection 26a for mounting the cutting blade 28. The front end projection 26a of the spindle 26 is provided with a blade mount 30. An external thread 32 is formed on the outer circumferential surface of the front end projection 26a in the vicinity of the front end thereof. The cutting blade 28 is composed of a circular base 34 having a circular hub 36 and a cutting edge 40 formed along the outer circumference of the circular base 34 by electroforming of diamond abrasive grains. The circular base 34 has a central mounting hole 38 for engaging the front end projection 26a of the spindle 26. Reference numeral 42 denotes a nut having an internal thread. In the condition where the cutting blade 28 is mounted on the blade mount 30 of the spindle 26, the nut 42 is threadedly engaged with the external thread 32 of the front end projection 26a of the spindle 26, thereby fixing the cutting blade 28 to the spindle 26.

Figure 4A:
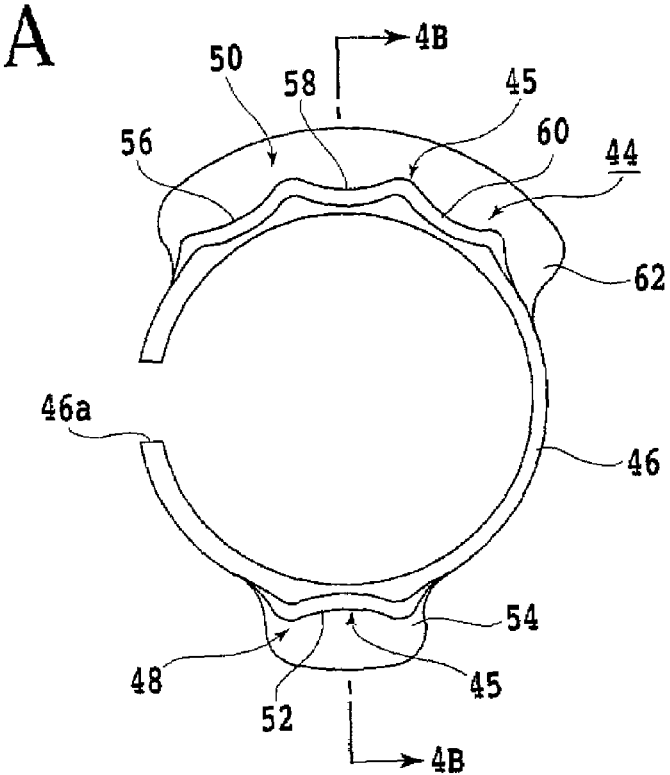
FIG. 4A is a plan view of a blade changing tool according to a first preferred embodiment of the present invention.
Figure 4B:
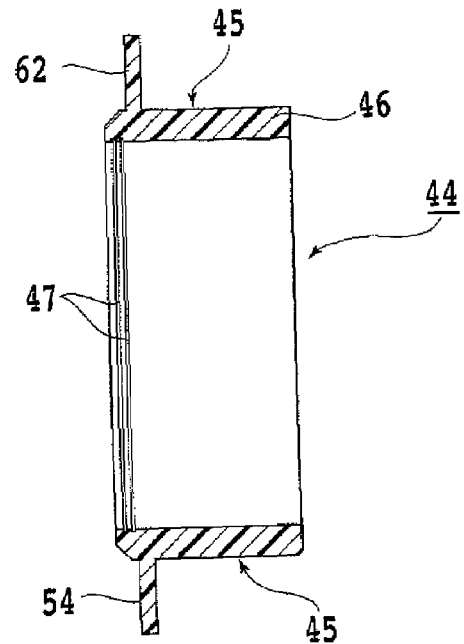
FIG. 4B is a cross section taken along the line 4B-4B in FIG. 4A.

There will now be described a blade changing tool 44 according to a first preferred embodiment of the present invention for use in mounting or demounting the cutting blade 28 to/from the spindle 26 with reference to FIGS. 4A and 4B. FIG. 4A is a plan view of the blade changing tool 44, and FIG. 4B is a cross section taken along the line 4B-4B in FIG. 4A. The blade changing tool 44 is formed by molding of resin as an elastic material, and it includes a C-shaped cylindrical body 46 having a cutout 46a as formed by cutting out a part of a circular cylinder. The cutout 46a of the cylindrical body 46 corresponds to an arc having a central angle of 20° to 30°, for example as viewed in FIG. 4A. However, the range of the central angle is not limited. Further, the material of the blade changing tool 44 is not limited to resin, but any other elastic materials such as rubber may be used.

As best shown in FIG. 4B, holding grooves 47 are formed on the inner circumferential surface of the cylindrical body 46 at one end portion thereof. The holding grooves 47 are adapted to surround the circular hub 36 of the cutting blade 28. The outer circumferential surface of the cylindrical body 46 is formed with a grip portion 45 adapted to be gripped by the operator in changing the cutting blade 28. The grip portion 45 operates to make a change from an inoperative condition where the circular hub 36 of the cutting blade 28 is surrounded by the inner circumference of the cylindrical body 46 to an operative condition where the circular hub 36 is held by the inner circumference of the cylindrical body 46. The grip portion 45 is composed of a thumb receiving portion 48 for receiving the thumb and a three-finger receiving portion 50 formed opposite to the thumb receiving portion 48 with respect to the cutout 46a for receiving the index finger, middle finger, and ring finger.

The thumb receiving portion 48 is composed of a first concave portion 52 and a first stopper portion 54. The first concave portion 52 is formed on the outer circumference of the cylindrical body 46 and adapted to fittedly receive the thumb holding the grip portion 45. The first stopper portion 54 is formed on the outer circumference of the cylindrical body 46 at the same circumferential position as that of the first concave portion 52 so as to project radially outward at the one end portion of the cylindrical body 46 where the holding grooves 47 are formed. On the other hand, the three-finger receiving portion 50 is composed of second, third, and fourth concave portions 56, 58, and 60 and a second stopper portion 62. The second, third, and fourth concave portions 56, 58, and 60 are formed on the outer circumference of the cylindrical body 46 and adapted to respectively fittedly receive the index finger, middle finger, and ring finger holding the grip portion 45. The second stopper portion 62 is formed on the outer circumference of the cylindrical body 46 at the same circumferential position as that of the second, third, and fourth concave portions 56, 58, and 60 so as to project radially outward at the one end portion of the cylindrical body 46 where the holding grooves 47 are formed. The blade changing tool 44 is a right-handed blade changing tool because the circular hub 36 of the cutting blade 28 is intended to be visually checked by a right-handed operator through the cutout 46a in holding the circular hub 36.

Figure 5A:
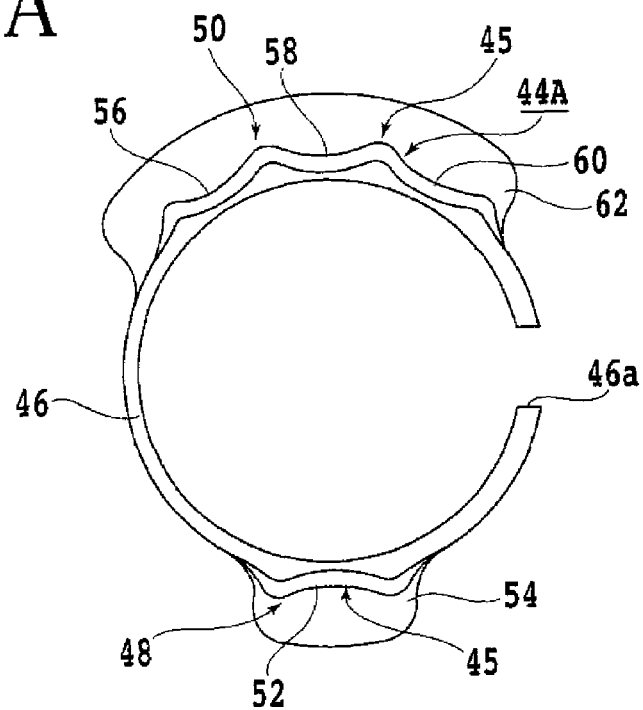
FIG. 5A is a plan view of a blade changing tool according to a second preferred embodiment of the present invention.

Referring next to FIG. 5A, there is shown a plan view of a left-handed blade changing tool 44A according to a second preferred embodiment of the present invention. The left-handed blade changing tool 44A is designed for a left-handed operator so that the circular hub 36 of the cutting blade 28 is intended to be visually checked by the left-handed operator through the cutout 46a in holding the circular hub 36. Accordingly, the cutout 46a of the blade changing tool 44A according to the second preferred embodiment is formed at a position radially opposite to the position of the cutout 46a of the blade changing tool 44 according to the first preferred embodiment. The other configuration is similar to that of the blade changing tool 44 according to the first preferred embodiment, so the description thereof will be omitted herein.

Figure 5B:
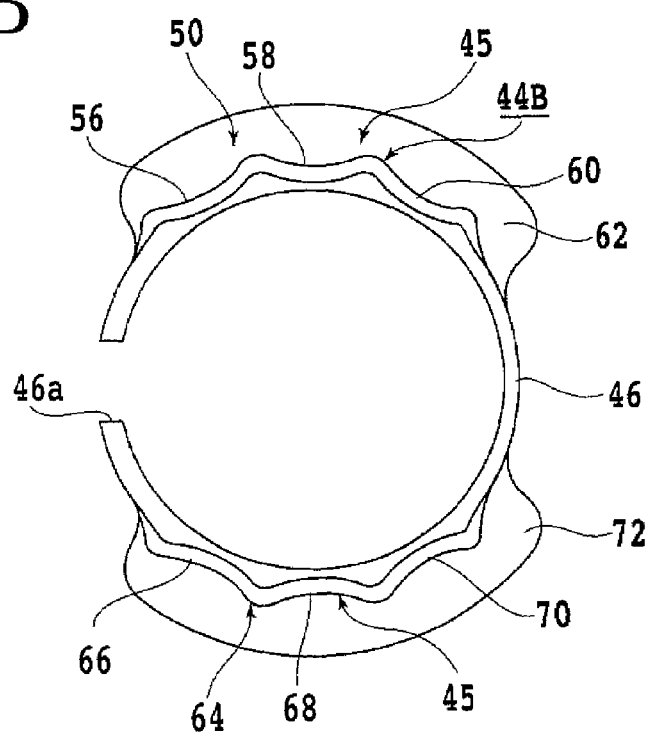
FIG. 5B is a plan view of a blade changing tool according to a third preferred embodiment of the present invention.

Referring next to FIG. 5B, there is shown a plan view of a blade changing tool 44B according to a third preferred embodiment of the present invention. The blade changing tool 44B is designed for both the right-handed operator and the left-handed operator by forming a second three-finger receiving portion 64 in place of the thumb receiving portion 48 of the blade changing tool 44 according to the first preferred embodiment shown in FIGS. 4A and 4B. In the blade changing tool 44B shown in FIG. 5B, the three-finger receiving portion 50 is a three-finger receiving portion for the right-handed operator, and the second three-finger receiving portion 64 is a three-finger receiving portion for the left-handed operator.

The second three-finger receiving portion 64 is composed of fifth, sixth, and seventh concave portions 66, 68, and 70 and a third stopper portion 72. The fifth, sixth, and seventh concave portions 66, 68, and 70 are formed on the outer circumference of the cylindrical body 46 and adapted to respectively fittedly receive the index finger, middle finger, and ring finger of the left hand holding the grip portion 45. The third stopper portion 72 is formed on the outer circumference of the cylindrical body 46 at the same circumferential position as that of the fifth, sixth, and seventh concave portions 66, 68, and 70 so as to project radially outward at the one end portion of the cylindrical body 46 where the holding grooves 47 are formed.

In the case that the blade changing tool 44B is used by the right-handed operator, the second, third, and fourth concave portions 56, 58, and 60 of the three-finger receiving portion 50 are adapted to respectively receive the index finger, middle finger, and ring finger of the right hand, and any one of the fifth, sixth, and seventh concave portions 66, 68, and 70 of the second three-finger receiving portion 64, e.g., the sixth concave portion 68, is adapted to receive the thumb of the right hand. On the other hand, in the case that the blade changing tool 44B is used by the left-handed operator, the fifth, sixth, and seventh concave portions 66, 68, and 70 of the second three-finger receiving portion 64 are adapted to respectively receive the index finger, middle finger, and ring finger of the left hand, and any one of the second, third, and fourth concave portions 56, 58, and 60 of the three-finger receiving portion 50, e.g., the third concave portion 58, is adapted to receive the thumb of the left hand.

Figure 6A:
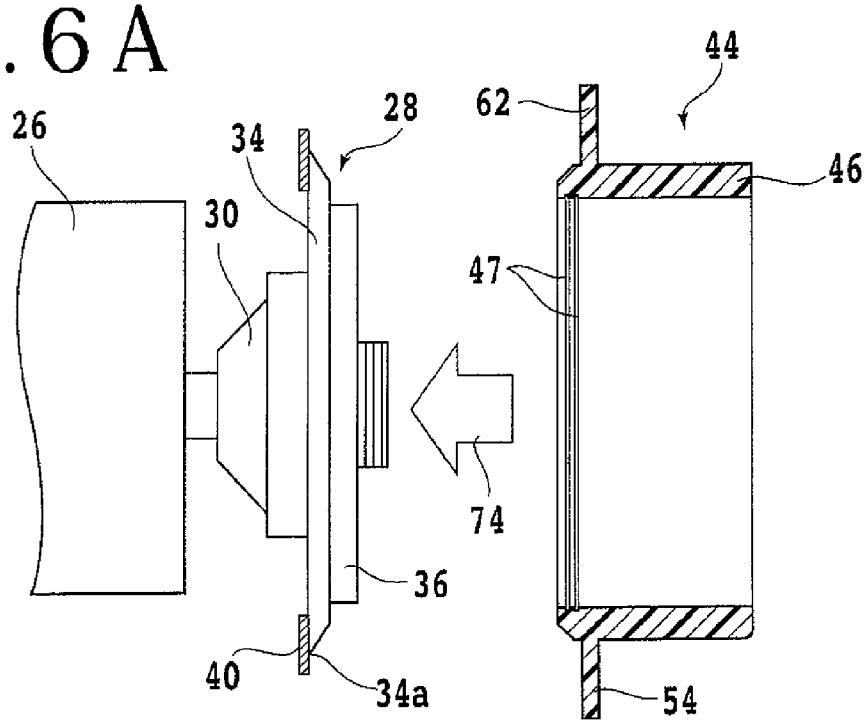
FIGS. 6A, 6B, and 7 are sectional side views for illustrating the operation of the blade changing tool according to the first preferred embodiment of the present invention in removing the cutting blade from the blade mount of the spindle.
Figure 6B:
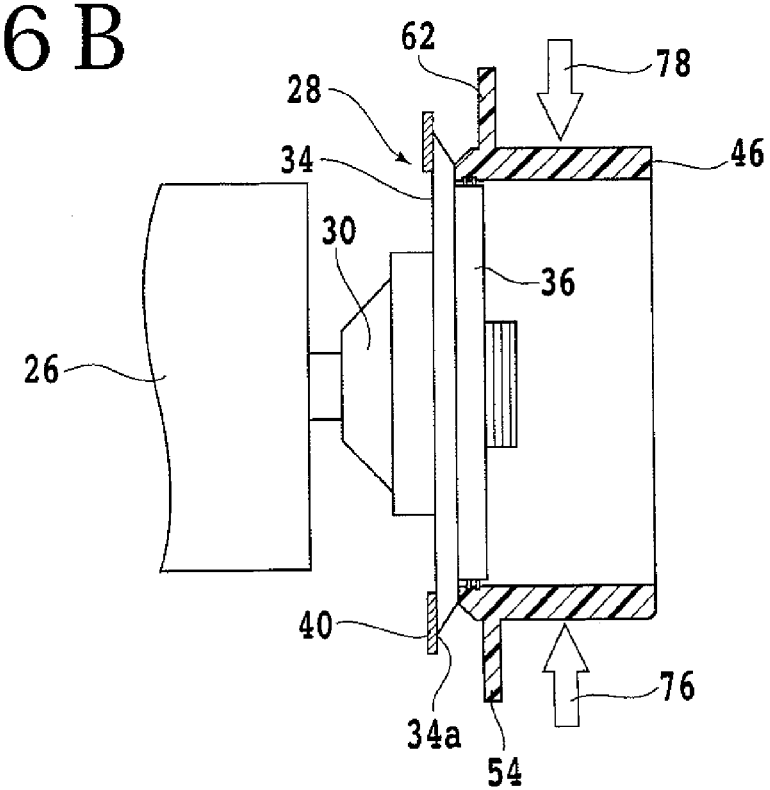

The operation of the blade changing tool 44 according to the first preferred embodiment in removing the cutting blade 28 will now be described with reference to FIGS. 6A, 6B, and 7. As shown in FIG. 6A, the blade changing tool 44 is brought close to the cutting blade 28 as shown by an arrow 74 as the circular hub 36 of the cutting blade 28 is being visually checked by the operator through the cutout 46a of the cylindrical body 46. Thereafter, as shown in FIG. 6B, the circular hub 36 of the cutting blade 28 is surrounded by the inner circumference of the cylindrical body 46 of the blade changing tool 44 at the one end portion where the holding grooves 47 are formed, and a holding force is next applied to the thumb receiving portion 48 and the three-finger receiving portion 50 by the operator as shown by arrows 76 and 78, thereby holding the circular hub 36 of the cutting blade 28.

Figure 7:
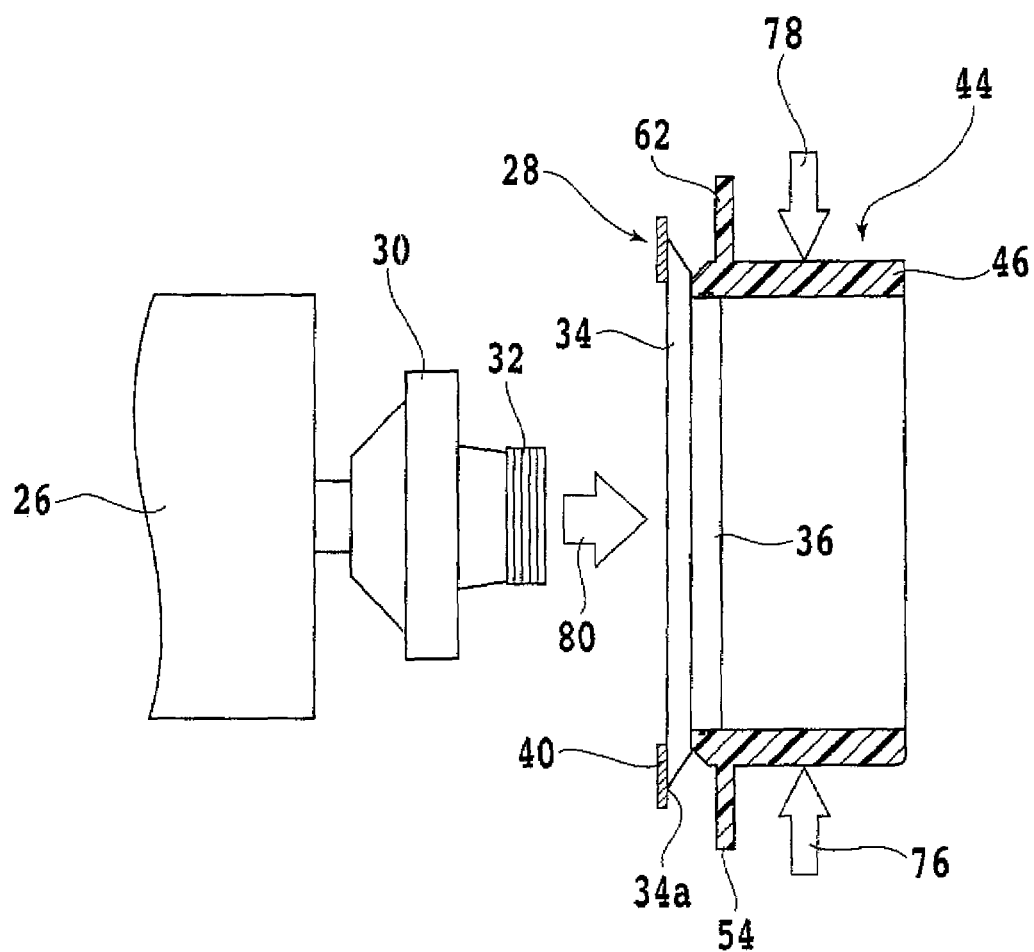

Thereafter, as shown in FIG. 7, the blade changing tool 44 is drawn as shown by an arrow 80 in the condition where the circular hub 36 of the cutting blade 28 is held by the blade changing tool 44. Thus, the cutting blade 28 can be easily removed from the blade mount 30 of the spindle 26. When the circular hub 36 of the cutting blade 28 is held by the blade changing tool 44, the holding grooves 47 formed on the inner circumferential surface of the cylindrical body 46 are fitted to the outer circumference of the circular hub 36, thereby providing stable holding of the circular hub 36. If the holding grooves 47 are not formed on the inner circumferential surface of the cylindrical body 46, it is difficult to stably hold the circular hub 36 by the blade changing tool 44 because of easy slip between the contact surfaces of the circular hub 36 and the cylindrical body 46.

Figure 8:
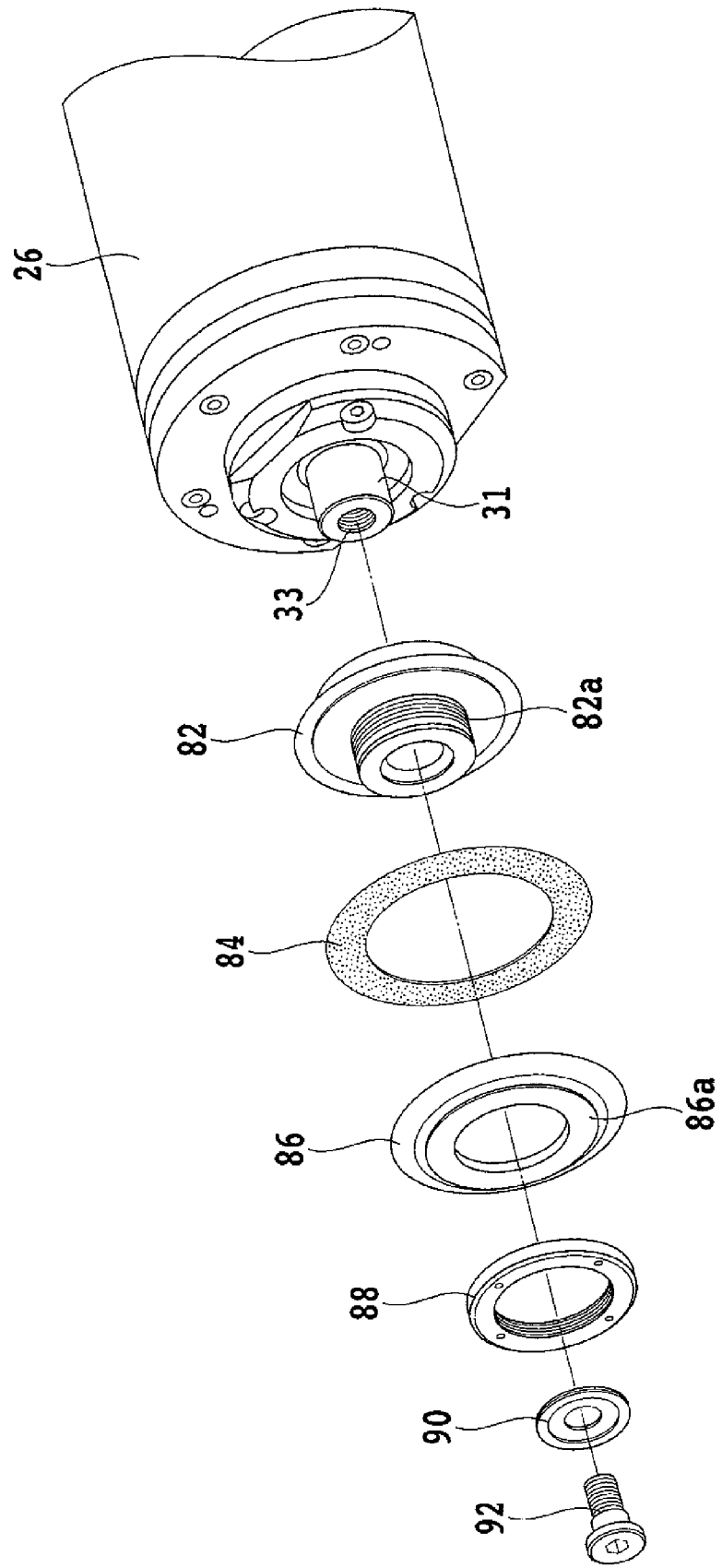
FIG. 8 is an exploded perspective view showing another configuration such that a pair of flanges respectively having circular hubs are used to mount a ringlike cutting blade to the blade mount of the spindle.

The blade changing tool according to the present invention is usable not only for the replacement of a cutting blade (hub blade) having a circular hub as mentioned above, but also for the replacement of flanges 82 and 86 respectively having circular hubs 82a and 86a as shown in FIG. 8. Referring to FIG. 8, the spindle 26 has a small-diameter front end projection 31 formed with a tapped hole 33. The circular hub 82a of the first flange 82 is formed with an external thread. Reference numeral 84 denotes a ringlike cutting blade formed by electroforming diamond abrasive grains on a ringlike base. The ringlike cutting blade 84 is suitable for cutting of a resin board, glass plate, etc. The second flange 86 is provided to press the ringlike cutting blade 84 against the first flange 82, and has the circular hub 86a.

The ringlike cutting blade 84 is mounted to the spindle 26 in the following manner. First, the first flange 82, the ringlike cutting blade 84, and the second flange 86 are mounted in this order to the front end projection 31 of the spindle 26. Thereafter, a flange fixing nut 88 is set so as to abut against the circular hub 86a of the second flange 86 and is threadedly engaged with the external thread of the circular hub 82a of the first flange 82. Finally, a fixing bolt 92 is screwed into the tapped hole 33 of the front end projection 31 through a washer 90 abutting against the circular hub 82a of the first flange 82, thereby mounting the ring-like cutting blade 84 to the spindle 26.

The blade changing tools 44, 44A, and 44B according to the above preferred embodiments of the present invention are also usable for the replacement of the flanges 82 and 86 having the circular hubs 82a and 86a. According to the blade changing tools 44, 44A, and 44B mentioned above, the cutting blade 28 having the circular hub 36 can be changed easily and quickly without damage to the cutting edge 40.

The thumb receiving portion 48 and the three-finger receiving portion 50 respectively include the first stopper portion 54 and the second stopper portion 62. Accordingly, it is possible to prevent that the fingers gripping the blade changing tool may abut against the cutting blade 28 in changing the blade 28 to cause damage to the cutting edge 40 of the blade 28. Further, the outer diameter of the cylindrical body 46 of each of the blade changing tools 44, 44A, and 44B is smaller than the outer diameter of the circular base 34 of the cutting blade 28. Accordingly, it is possible to prevent that the blade changing tool may strike the cutting blade 28 to cause damage to the cutting edge 40 of the blade 28.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A blade changing tool for use in a cutting device including a chuck table for holding a workpiece, and cutting means including a blade mount for rotatably supporting a cutting blade for cutting said workpiece held by said chuck table, wherein said cutting blade includes
  a circular base including an insertion hole for insertion of a mounting projection formed at the center of said blade mount,
  a circular hub formed integrally with said circular base on one side surface of said circular base, and
  a cutting edge formed along the outer circumference of said circular base so as to project radially outward, and said blade changing tool comprises:

a C-shaped elastic cylindrical body including a cutout formed by cutting out a part of a circular cylinder;

a holding groove formed on the inner circumferential surface of said cylindrical body at one end portion thereof and adapted to surround said circular hub of said cutting blade; and a grip portion adapted to be gripped by an operator for making a change from an inoperative condition where said circular hub of said cutting blade is surrounded by the inner circumference of said cylindrical body to an operative condition where said circular hub is held by the inner circumference of said cylindrical body, wherein said grip portion comprises:

a thumb receiving portion for receiving the thumb of the right or left hand of said operator, said thumb receiving portion including, a first concave portion formed on the outer circumference of said cylindrical body and adapted to fittedly receive the thumb holding said grip portion, and a first stopper portion formed on the outer circumference of said cylindrical body at the same circumferential position as that of said first concave portion so as to project radially outward at said one end portion of said cylindrical body; and a three-finger receiving portion formed opposite to said thumb receiving portion with respect to said cutout for receiving the index finger, middle finger, and ring finger of the right or left hand of said operator said three-finger receiving portion including, second, third, and fourth concave portions formed on the outer circumference of said cylindrical body and adapted to respectively fittedly receive the index finger, middle finger, and ring finger holding said grip portion, and a second stopper portion formed on the outer circumference of said cylindrical body at the same circumferential position as that of said second, third, and fourth concave portions so as to project radially outward at said one end portion of said cylindrical body.

2. A blade changing tool for use in a cutting device including a chuck table for holding a workpiece, and cutting means including a blade mount for rotatably supporting a cutting blade for cutting said workpiece held by said chuck table, wherein said cutting blade comprises:

a circular base including an insertion hole for insertion of a mounting projection formed at the center of said blade mount, a circular hub formed integrally with said circular base on one side surface of said circular base, and a cutting edge formed along the outer circumference of said circular base so as to project radially outward, and said blade changing tool comprises:

a C-shaped elastic cylindrical body including a cutout formed by cutting out a part of a circular cylinder;

a holding groove formed on the inner circumferential surface of said cylindrical body at one end portion thereof and adapted to surround said circular hub of said cutting blade; and a grip portion adapted to be gripped by an operator for making a change from an inoperative condition where said circular hub of said cutting blade is surrounded by the inner circumference of said cylindrical body to an operative condition where said circular hub is held by the inner circumference of said cylindrical body;

wherein said grip portion comprises:

a first three-finger receiving portion for receiving the index finger, middle finger, and ring finger of the right hand of said operator;

second, third, and fourth concave portions formed on the outer circumference of said cylindrical body and adapted to respectively fittedly receive the index finger, middle finger, and ring finger of the right hand of said operator, a second three-finger receiving portion formed opposite to said first three-finger receiving portion with respect to said cutout for receiving the index finger, middle finger, and ring finger of the left hand of said operator; and fifth, sixth, and seventh concave portions formed on the outer circumference of said cylindrical body and adapted to respectively fittedly receive the index finger, middle finger, and ring finger of the left hand of said operator.

* * * * *